United States Patent
Moro et al.

(10) Patent No.: US 6,769,087 B2
(45) Date of Patent: Jul. 27, 2004

(54) DATA STORAGE DEVICE AND METHOD FOR CONTROLLING THE DEVICE

(75) Inventors: Hiroyuki Moro, Ome (JP); Takayoshi Fushinuki, Hamura (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 477 days.

(21) Appl. No.: 09/828,233

(22) Filed: Apr. 9, 2001

(65) Prior Publication Data

US 2001/0028523 A1 Oct. 11, 2001

(30) Foreign Application Priority Data

Apr. 11, 2000 (JP) ........................................ 2000-109542

(51) Int. Cl.$^7$ .............................................. G11C 29/00
(52) U.S. Cl. ..................................................... 714/763
(58) Field of Search .......................... 714/763; 365/200, 365/201; 360/26, 36.1, 47

(56) References Cited

U.S. PATENT DOCUMENTS

| | | | |
|---|---|---|---|
| 4,852,100 A | * | 7/1989 | Christensen et al. ........ 714/763 |
| 5,754,567 A | * | 5/1998 | Norman ....................... 714/773 |
| 5,765,185 A | | 6/1998 | Lambrache et al. ......... 711/103 |
| 6,144,607 A | * | 11/2000 | Sassa ..................... 365/230.03 |
| 6,256,762 B1 | * | 7/2001 | Beppu ......................... 714/763 |
| 6,282,624 B1 | * | 8/2001 | Kimura et al. .............. 711/202 |
| 6,345,333 B1 | * | 2/2002 | Sassa et al. ................. 711/103 |

\* cited by examiner

*Primary Examiner*—Albert Decady
*Assistant Examiner*—Esaw Abraham
(74) *Attorney, Agent, or Firm*—Finnegan, Henderson, Farabow, Garrett & Dunner, L.L.P.

(57) ABSTRACT

When system data is written to a flash memory, first and second ECCs are generated in correspondence with the system data and its copied data. The system data and the copied data are written to the same page. The first and second ECCs are stored in the redundant area of the page. In this data storage format, even when an uncorrectable bit error occurs in one of the system data and the copied data, correct data can be read out using the other data in which the error does not occur. Since the system data and the copied data are stored in the same page, they can be read out by one operation and thus the operation performance does not deteriorate.

12 Claims, 7 Drawing Sheets

| 0 | 255 | 256 | 511 | REDUNDANT AREA |
|---|---|---|---|---|
| DATA A | | | | |

USER DATA

| 0 | 255 | 256 | 511 | REDUNDANT AREA |
|---|---|---|---|---|
| DATA A | | | | |

SYSTEM DATA

| | UPPER-SIDE DATA | | |
|---|---|---|---|
| | 0bit ERROR | 1bit ERROR | 2bit ERROR |
| LOWER-SIDE DATA — 0bit ERROR | USE LOWER-SIDE DATA | USE LOWER-SIDE DATA | USE LOWER-SIDE DATA |
| LOWER-SIDE DATA — 1bit ERROR | USE UPPER-SIDE DATA | CORRECT AND USE LOWER-SIDE DATA | CORRECT AND USE LOWER-SIDE DATA |
| LOWER-SIDE DATA — 2bit ERROR | USE UPPER-SIDE DATA | CORRECT AND USE UPPER-SIDE DATA | DATA ERROR |

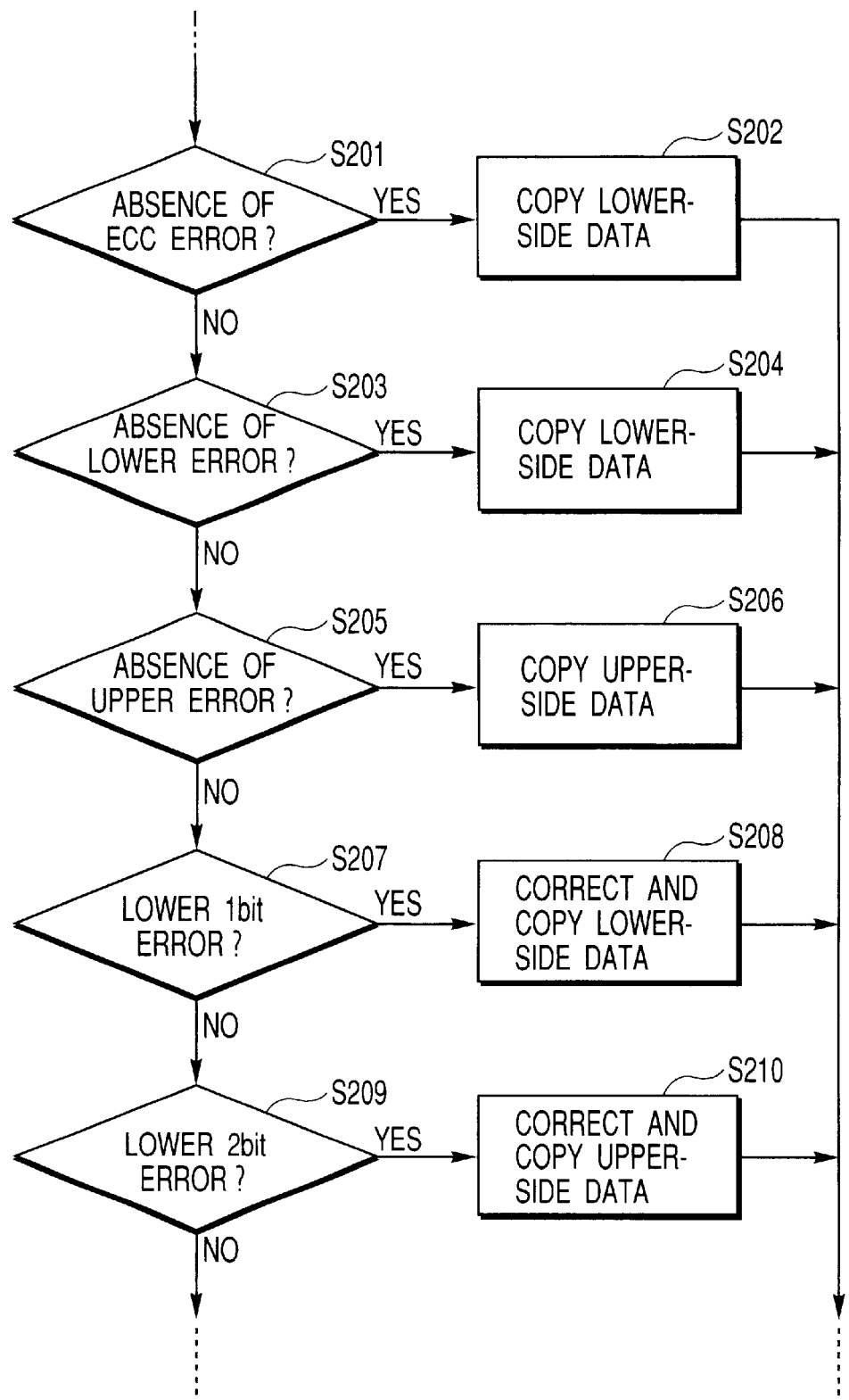
F I G. 10

DATA STORAGE DEVICE AND METHOD FOR CONTROLLING THE DEVICE

CROSS-REFERENCE TO RELATED APPLICATIONS

This application is based upon and claims the benefit of priority from the prior Japanese Patent Application No. 2000-109542, filed Apr. 11, 2000, the entire contents of which are incorporated herein by reference.

BACKGROUND OF THE INVENTION

The present invention relates to a data storage device for storing data and a method for controlling the device. More specifically, the present invention relates to a data storage device that has improved the reliability of data stored on a recording medium and a method for controlling the data storage device.

As computer technology advances, various types of electronic equipment, such as multimedia-capable personal computers, set-top boxes, audio/video players, and game machines, have recently been developed. In such electronic equipment, various digital contents, such as image data and music data, which are downloaded through the Internet or the like, can be stored on a recording medium and read and reproduced therefrom.

By adopting a digital compression encoding technique such as MPEG2 and MP3, the digital contents can be downloaded or copied from one recording medium to another without loss of quality. There is a crying need for protecting the digital contents from unauthorized use from the viewpoint of protection by copyright.

Authentication and encryption techniques have recently been developed in order to allow the transfer of contents only between devices having a legal copyright protecting function.

As a typical authentication and encryption technique, the following mechanism has been devised. Authentication and key exchange are performed between the recording medium and the electronic equipment accessing it, using identification information proper to the recording medium. Using an encryption key generated by the authentication and key exchange, data stored on the recording medium is encrypted and decrypted. As another technique, the following mechanism is used: A password is recorded on a recording medium, and the read/write of data from/to the medium is allowed or inhibited according to agreement of the password with the user's keyed password.

The above techniques are used for maintaining the security of recorded data, and it is expected that the value of such techniques will steadily increase.

However, when system data necessary for data security, such as the above identification information and password, is recorded on a recording medium, and a bit error occurs in the system data, an authentication error occurs in spite of the use of authorized electronic equipment or an authorized user. The user cannot use the contents stored on the recording medium.

BRIEF SUMMARY OF THE INVENTION

The object of the present invention is to provide a data storage device capable of recording data with considerably high reliability by greatly reducing an error from occurring in important recording data such as system data necessary for security, and a method of controlling the device.

In order to attain the above object, a data storage device for storing data according to the present invention comprises a nonvolatile semiconductor memory, including a plurality of pages each having a data area and a redundant area, for allowing a data read/write operation to be performed in units of page; means for generating a first error correcting code and a second error correcting code from first data and second data, respectively, the first data being to be written and the second data being a copy of the first data; and a write control unit configured to write the first data and the second data to the data area in one page of the nonvolatile semiconductor memory and write the first and second error correcting codes, which are generated by the error correcting code generating means, to the redundant area of the one page to which the first data and the second data are written.

In the data storage device so constituted, even when an uncorrectable bit error occurs in one of the first data and its copied second data, correct data can be obtained using the other data and its corresponding error correcting code. Since the first and second data are stored in the same page, they can be read out by only one operation and thus the operation performance can be prevented from deteriorating. Since, moreover, the first and second error correcting codes are stored in the same page as that of the first and second data, they can be read out by one operation together with the first and second data.

In particular, the data size of system data necessary for security of storage data is smaller than that of normal user data or the like, and thus the system data and its copied data can easily be stored in the same page. Consequently, the mechanism of the present invention produces a remarkably good effect especially on the protection of system data, with the result that a defect due to a bit error in the system data can be prevented from occurring and a system having a function of securing storage data can be increased in reliability.

In a data storage device for performing a read/write operation in units of sector, such as a semiconductor disk drive and a magnetic disk drive, system data and its copied data and their corresponding tow ECCs can be recorded in the same sector.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 10 is a flowchart explaining a process of the ECC error check operation performed in the read operation shown in FIG. 9.

DETAILED DESCRIPTION OF THE INVENTION

An embodiment of the present invention will now be described with reference to the accompanying drawings.

Figure 1:
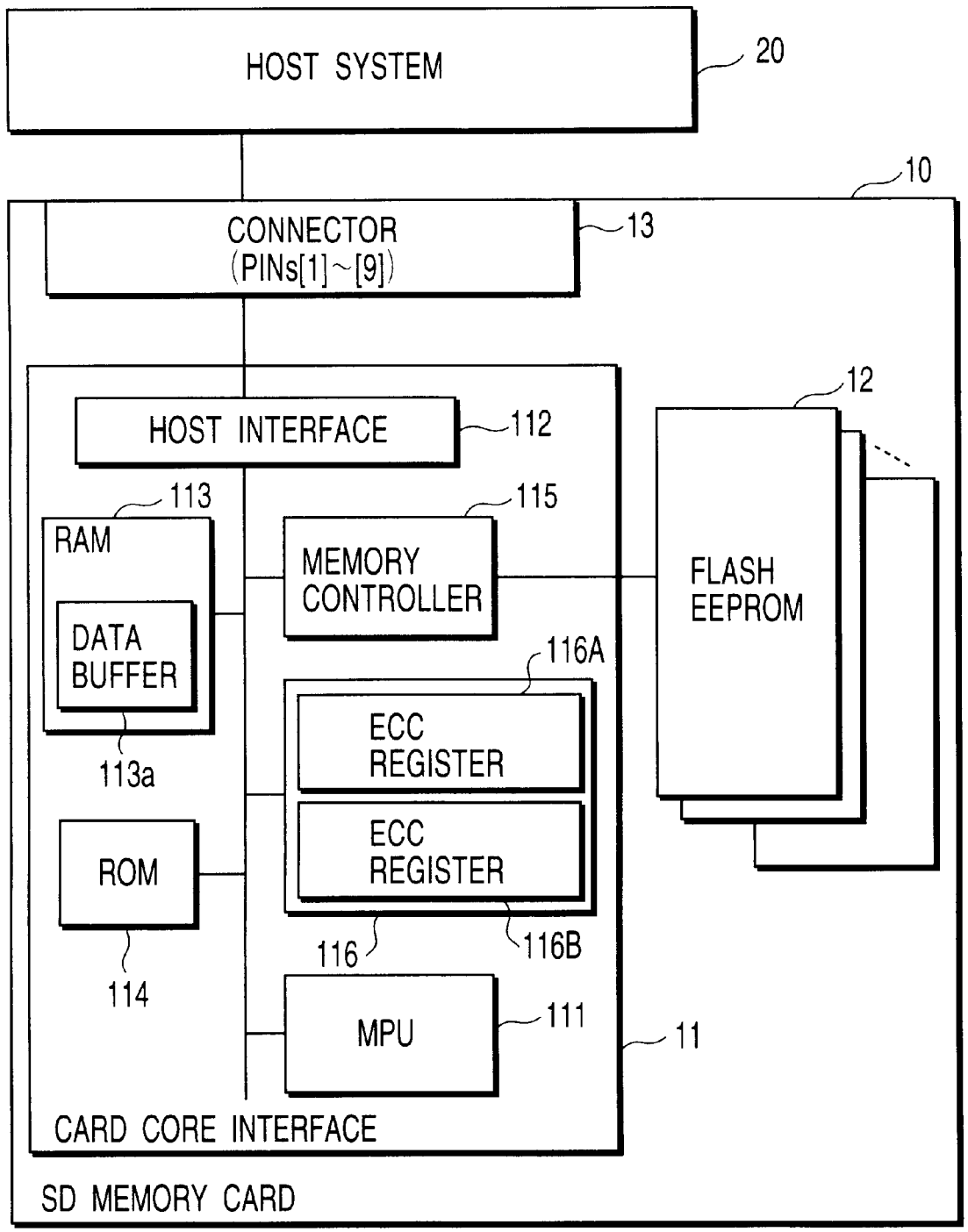
FIG. 1 is a block diagram showing an example of the structure of a data storage device according to an embodiment of the present invention.

FIG. 1 illustrates the structure of a data storage device according to the embodiment of the present invention. In this embodiment, an SD memory card (Secure Digital memory card) 10 will be described as an example of the data storage device.

The SD memory card 10 is a small-sized memory card for storing various digital contents such as image data, music data and other data. The SD memory card 10 is Flash-Based memory card that is specifically designed to meet the security, performance and environment requirements inherent in electronic equipments. It is inserted in various types of electronic equipment such as personal computers, PDAs, set-top boxes, audio/video players, game machines and cellular phones. Electronic equipment in which the SD memory card 10 is inserted operates as a host system 20 for controlling the card 10. The host system 20 writes data to the SD memory card 10, reads data therefrom, and controls the memory card 10 to secure the data stored in the card 10.

More specifically, an authentication process is executed to confirm whether the SD memory card 10 and the host system 20 are both authorized or not, using card ID as identification information proper to the card 10 and/or revocation list information referred to as a media key block (MKB) for revoking invalid electronic equipment. The card ID and revocation list information are stored in advance in the SD memory card 10. If authentication succeeds between the SD memory card 10 and the host system 20, key exchange is performed therebetween. Thus, a key necessary for encrypting data to be recorded on the SD memory card 10 and for decrypting data encrypted and recorded on the SD memory card 10 is generated by the host system 20. The host system 20 controls encryption/decryption of recording data using the key, and allows or inhibits read/write of data from/to the SD memory card 10 according to agreement of the password registered in the card 10 and the user's keyed password.

The SD memory card 10 has a card-like housing including a card core interface 11, a flash memory (memory core) 12, and a connector 13 for connecting the card 10 to the host system 20, as shown in FIG. 1.

The connector 13 includes nine signal pins [1] to [9]. The assignment of the pins is as follows.

A card detection signal (CD) and data (DATA3) are assigned to the signal pin [1]. The card detection signal (CD) is a signal for notifying the host system 20 that the SD memory card 10 is inserted. A command signal (CMD) used for transfer of command/status is assigned to the signal pin [2]. A ground power supply voltage (Vss1) and a positive power supply voltage (Vdd) are assigned to the signal pins [3] and [4], respectively. A sync clock signal (CLK) for transfer of command/status is assigned to the signal pin [5], and a ground power supply voltage (Vss2) is assigned to the signal pin [6]. Data (DATA0), data (DATA1) and data (DATA2) are assigned to the signal pins [7] to [9], respectively.

Data transfer between the SD memory card 10 and the host system 20 is performed in four bits width using four data lines (DATA0, DATA1, DATA2, DATA3).

The card core interface 11 is a single LSI having an access control function for controlling access to the flash memory 12, a management function for managing data stored in the flash memory 12, and an interface function for interfacing the interface 11 with the host system 20. As shown, the card core interface 11 includes an MPU (microprocessing unit) 111, a host interface 112, a RAM 113, a ROM 114, a memory controller 115, and a register group 116.

The MPU 111 is a processor for controlling the operation of the card core interface 11. The processor executes computer programs (firmware) stored in the ROM 114 to control the other units in the card core interface 11. The firmware has a function of greatly reducing an error occurring in various types of system data, such as the foregoing card ID and password and the card attribute information (memory size, ROM/RAM type, etc.) of the SD memory card 10. The objective of the function is to supply correct system data to the host system 20 even though a slight bit error occurs in the system data. The objective is attained as follows: The system data and its copied data are written to the same page (to which the system data should be written) of the flash memory 12, and their error-correcting codes (ECC) are generated and written to the memory 12 together with the system data and the copied data.

The RAM 113 is a working memory of the MPU 111. The working memory includes a storage region used as a data buffer 113a for temporarily holding data that is transferred between the flash memory 12 and the RAM 113. The memory controller 115 is memory core interface logic for controlling memory access operations necessary for access control of the flash memory 12 under the control of the MPU 111.

When data is written to the flash memory 12, an ECC, which is generated from the data, is read out of an ECC register 116A of the register group 116 and written to the same page of the flash memory 12 together with the data.

Figures 2, 3A, 3B:
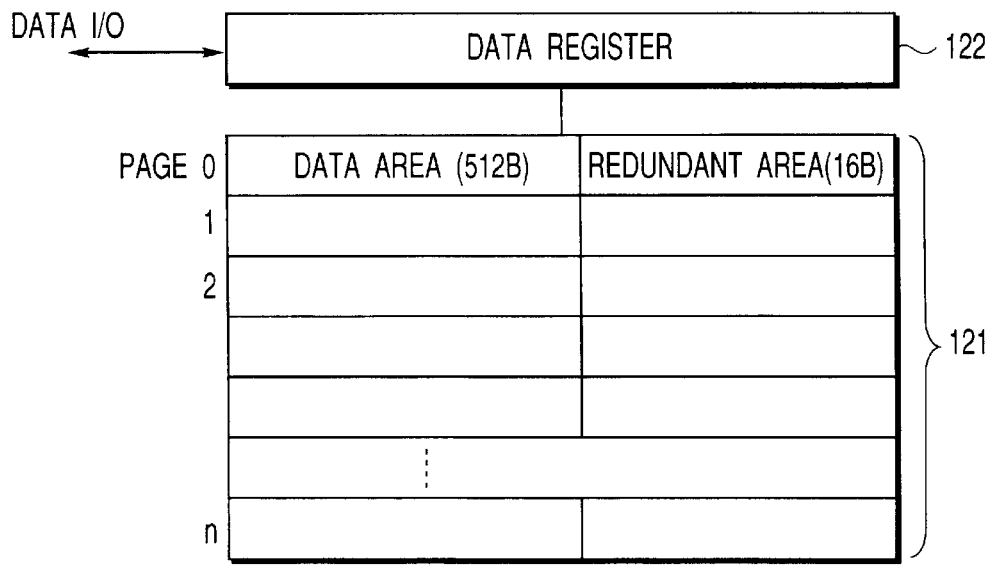
FIG. 2 is a block diagram of the structure of a nonvolatile semiconductor memory provided in the data storage device shown in FIG. 1.
FIGS. 3A and 3B are diagrams of data recording formats used in the data storage device shown in FIG. 1.

The flash memory 12 includes a plurality of flash EEPROMs of nonvolatile semiconductor memories. Each of the flash EEPROMs is an X8-bit-configured NAND EEPROM chip and, as shown in FIG. 2, it comprises a memory cell array 121 including a number of pages (0 to n) each having a data storage size of 512+16 bytes. Each page (corresponding to a row of the memory cell array 121) is constituted of a 512-byte data area and a 16-byte redundant area, as illustrated in FIG. 2. The redundant area is used to store ECCs and rewrite number data. Since data is written/read to/from the memory cell array 121 row by row or in page units of 512+16 bytes, each flash EEPROM includes a (512+16)-byte data register 122. In write mode, write data of 512+16 bytes for one page is transferred from the memory controller 115 to the data register 122 and then transferred to a write-target page in the memory cell array 121. In read mode, data of one page is transferred from a read-target page in the memory cell array 121 to the data register 122 and then transferred to the memory controller 115 therefrom. Only the write/read of data to/from the redundant area can be performed independently of that of data to/from the data area.

The flash EEPROM is accessed by a command-control fashion, in which an operation mode of the flash EEPROM is designated by a command from the memory controller 115. More specifically, under the control of the MPU 111, the memory controller 115 first designates an operation mode (a write mode, a read mode, an erase mode, a verify mode, etc.) of the flash EEPROM and then supplies the flash EEPROM with an address indicative of an access position (address and write data in write mode). In write mode, a write operation for one page is performed automatically in the flash EEPROM after page data of 512+16 bytes is transferred to the data register 212.

The size (512 bytes) of the data area of one page corresponds to one sector of a disk drive such as a hard disk drive, and the SD memory card 10 can be accessed by a normal file system alongside the host system 20. In this case, the function of a device driver for the SD memory card 10, which is performed on the host system 20, or that of the MPU 111 in the SD memory card 10 allows a logical disk access address to be converted into a real memory address necessary for actually accessing the flash memory 12.

(Data Storage Format)

Figures 4, 5:
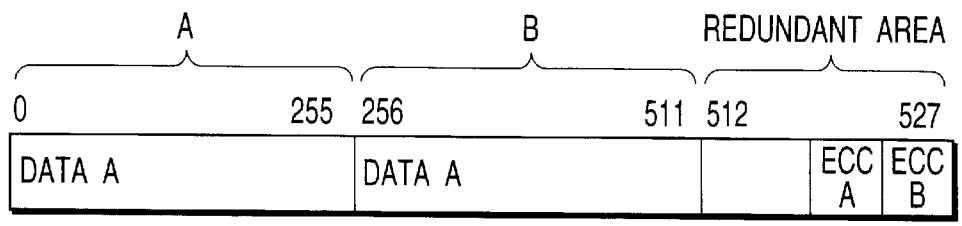
FIG. 4 is a diagram specifically showing a recording format of system data and its corresponding ECC data in the data storage device of FIG. 1.
FIG. 5 is a diagram showing a relationship between bit errors and read data to be used in the data storage device of FIG. 1.

Referring to FIGS. 3 and 4, a data storage format for use in the SD memory card 10 will now be described.

In the present embodiment, user data (data A) is stored in the data area of one page of the flash memory 12 as shown in FIG. 3A. On the other hand, system data of 256 bytes or less (card identification information, a password, card attribute information, etc.) is copied, and the same data (data A, data A) is stored in a lower-side 256-byte (0 to 255) area and an upper-side 256-byte (256 to 511) area in the data area of a target page, as illustrated in FIG. 3B.

As shown in FIG. 4, the original system data (data A) is written to the lower-side area A, while the copied data (data A) of the system data is written to the upper-side area B. Moreover, an ECC (ECC-A), which is generated from the original data written to be the lower-side area A, and another ECC (ECC-B), which is generated from the copied data written to be the upper-side area B, are written to the redundant area of the page.

In the present embodiment, the performance of ECC is as follows: The number of error detectable bits per 256-byte data is 2 and the number of error correctable bits is 1. A 3-byte ECC is generated for each 256-byte data. Thus, ECC-A and ECC-B are each 3-byte data.

The ECC generating method in which a 3-byte ECC is generated for each data of 256 bytes, is applied to the case where data of one page (512 bytes) is written to the page as shown in FIG. 3A. In this case, a 3-byte ECC is generated from the lower-side 256-byte data in data of one page, and another 3-byte ECC is generated from the upper-side 256-byte data therein.

The majority-operation system requires writing at least three data items as one set, whereas the present embodiment requires only two data items of the original data and its copied data to be written. Furthermore, in the present embodiment, block data containing the original data and its copied data is generated as page data that is to be written to the same page, and ECCs are added to the block data. The two data items and ECCs (original data and copied data) can thus be read out of the flash memory 12 by one read operation.

(Error Detection and Correction in Data Read Operation)

In a data read operation for reading system data out of the flash memory 12, an error detecting operation and an error correcting operation are performed for the original data and its copied data by the method shown in FIG. 5. Thus, data (original data or copied data) to be used is determined, and necessary error correction is performed therefor as follows:

(1) When the lower-side data (original data) has a 0-bit error, the lower-side data is used, irrespective of the number of error bits of the upper-side data (copied data).

(2) When the lower-side data has a 1-bit error and the upper-side data has a 0-bit error, the upper-side data is used. When the lower-side data has a 1-bit error and the upper-side data has a 1-bit error or a 2-bit error, the lower-side data is corrected and used.

(3) When the lower-side data has a 2-bit error and the upper-side data has a 0-bit error, the upper-side data is used. When the lower-side data has a 2-bit error and the upper-side data has a 1-bit error, the upper-side data is corrected and used. When the lower-side data has a 2-bit error and the upper-side data has also a 2-bit error, it is determined that uncorrectable data error occurs.

(Generation of ECC)

As described above, an ECC is generated in units of 256-byte data in the present embodiment. When data is written to the flash memory 12, its corresponding ECC is done together therewith. In a read operation, an ECC newly generated from data read out of the data area is compared with that read out of the redundant area to determine whether an error occurs in the data read out of the data area. If an error occurs, it is corrected using the ECC read out of the redundant area. In a system data read operation, an error is detected and corrected, using system data read out of the data area and its copied data and two ECCs (ECC-A, ECC-B) read out of the redundant area. In this case, first, ECC-A and ECC-B are newly obtained by calculation from their corresponding system data and copied data read out of the data area. Then, the newly obtained ECC-A is compared with the ECC-A read out of the redundant area, and an error detecting operation is performed for the system data based on the comparison results. Similarly, the newly obtained ECC-B is compared with the ECC-B read out of the redundant area, and an error detecting operation is performed for the copied data based on the comparison results. In accordance with the results of error detection, data to be supplied to the host system 20 is selected and a necessary error correcting operation is performed.

Figure 6:
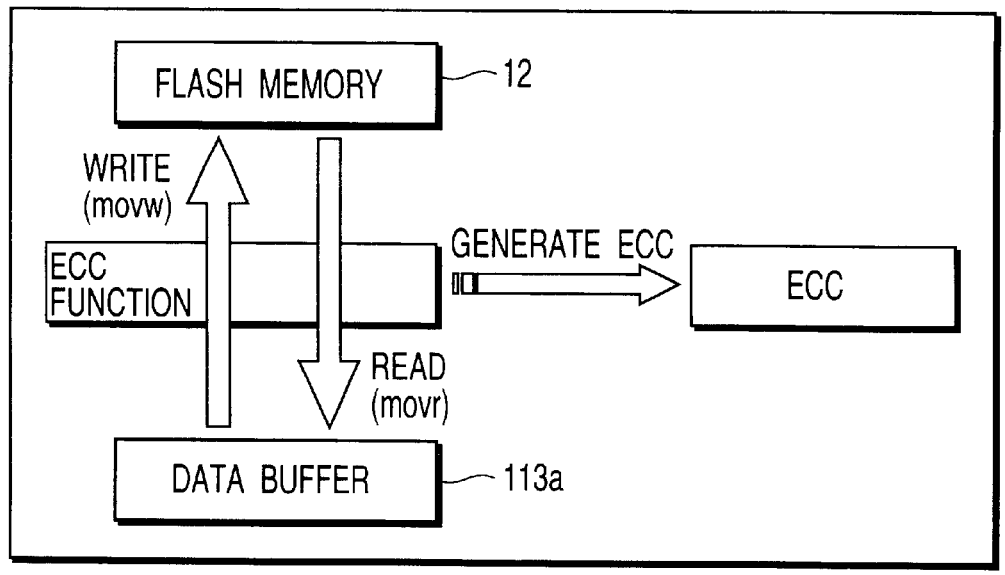
FIG. 6 is a block diagram explaining the principle of an ECC generating operation performed in a write operation of the data storage device shown in FIG. 1.

The ECC generating operation is carried out by an ECC function provided in the firmware. The ECC function is, as shown in FIG. 6, incorporated in macro instructions "movr" (a data read instruction to read data from the flash memory 12) and "movw" (a data write instruction to write data to the memory 12), which are prepared in the firmware. The macro instructions cause the memory controller 15 to execute DMA transfer between the flash memory 12 and the data buffer 113a. If the macro instructions are carried out when an ECC enable flag, which is an internal flag of the MPU 111, is in an ON state, write data is transferred to the data buffer 122 of the flash memory 12 and an ECC is generated automatically by MPU 111.

(Data Write Operation)

In order to write system data to the flash memory 12, the system data and its copied data are prepared in the data buffer 113a and then the ECC enable flag is set in an ON state to execute the macro instruction "movw". The ECC generated by the macro instruction "movw" is stored in the ECC register 116A. The following is the relationship between the ECCs stored in the ECC register 116A and the locations thereof in the redundant area:

Redundant Location [13]→ECC0_0 (8022h), Redundant Location [14]→ECC0_1 (8023h), and Redundant Location [15]→ECC0_2 (8024h), which correspond to upper-side data.

Redundant Location [08]→ECC1_0 (8025h), Redundant Location [09]→ECC1_1 (8026h), and Redundant Location [10]→ECC1_2 (8027h), which correspond to lower-side data.

In the above relationship, (8022h) to (8027h) represent register addresses in the ECC register 116A, and [13], [14], [15], [08], [09] and [10] indicate byte locations in the redundant area of 16 bytes [00]–[15]. In other words, ECC1_0, ECC1_1, and ECC1_2 of ECC-A, which correspond to the lower-side data, are stored in their respective eighth, ninth, and tenth bytes locations in the 16-byte redundant area, while ECC0_0, ECC0_1, and ECC0_2 of ECC-B, which correspond to the upper-side data, are stored in their respective thirteenth, fourteenth, and fifteenth bytes locations in the 16-byte redundant area.

Write data, which is generated in the format as described with reference to FIG. 4 by adding ECC-A (ECC1_0 to ECC1_2) and ECC-B (ECC0_0 to ECC0_2) to the block data including system data and its copied data, can be transferred to the data buffer 122 of the flash memory 12.

(Data Read Operation)

Figure 7:
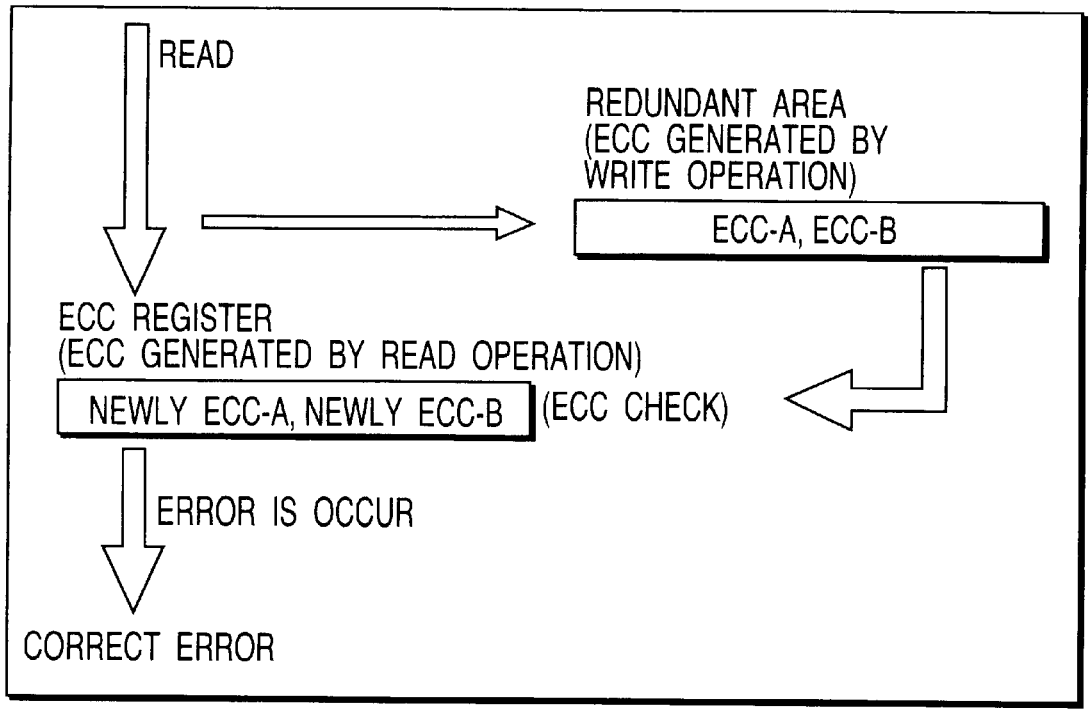
FIG. 7 is a block diagram explaining the principle of an ECC error check operation performed in a read operation of the data storage device shown in FIG. 1.

In order to read system data out of the flash memory 12, an ECC enable flag, which is an internal flag, is set in an ON state to execute the macro instruction "movr". ECCs are therefore generated from each of the lower-side data and the upper-side data, as shown in FIG. 7. The newly generated ECCs (ECC-A, ECC-B) are compared with ECCs (ECC-A, ECC-B) read from the redundant area and corresponding to the lower- and upper-side data to thereby perform an error check operation.

(Flow of Data Write Operations)

Figure 8:
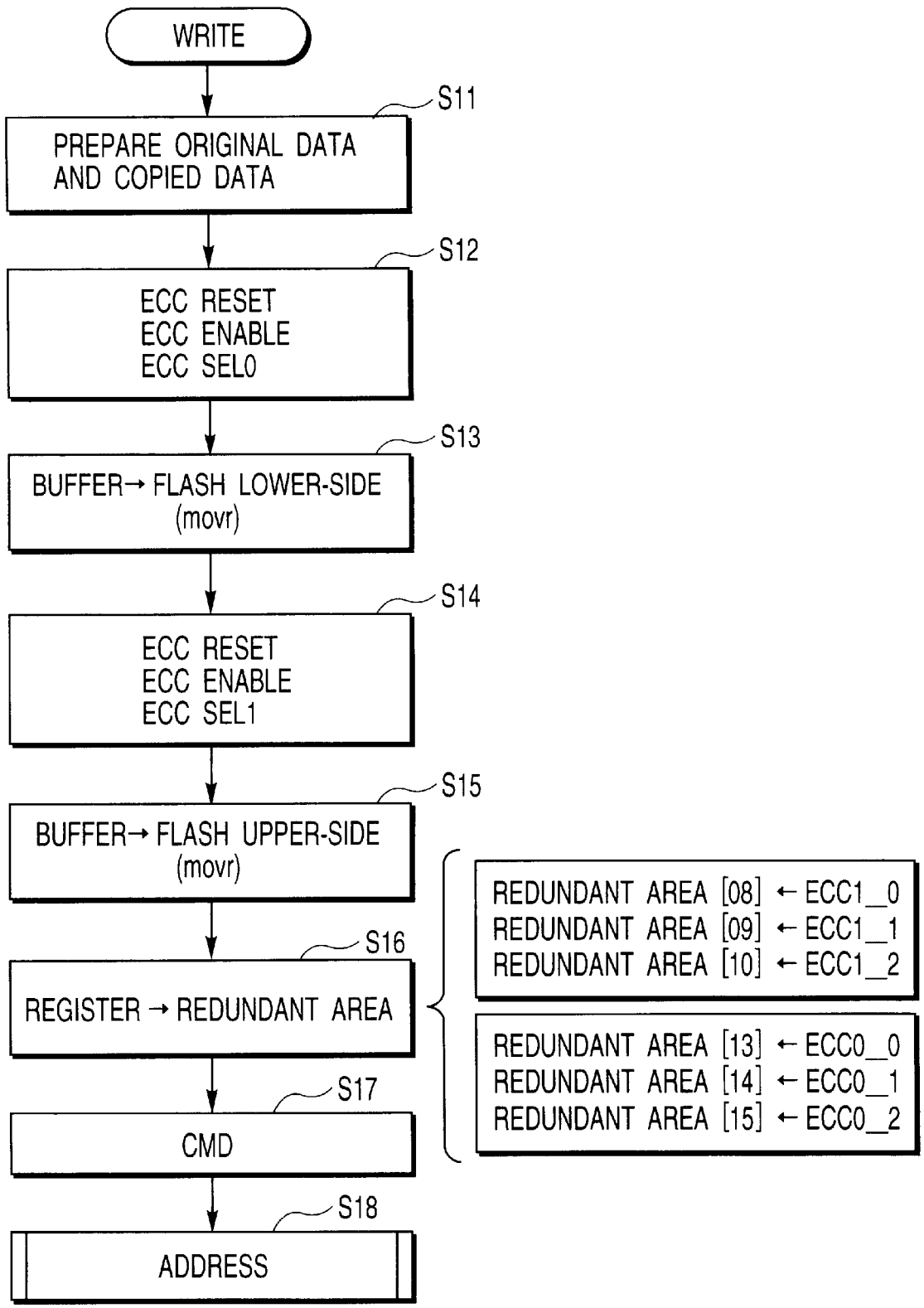
FIG. 8 is a flowchart showing a process of the write operation of the data storage device shown in FIG. 1.

A sequence of data write operations will now be described with reference to the flowchart shown in FIG. 8.

Basically, the data write operation for writing system data of 256 bytes or less to the flash memory 12 is performed through the following steps:

(1) Prepare system data (original data) and its copied data;
(2) Generate ECCs corresponding to the original data and the copied data; and
(3) Write block data containing the original data and the copied data to a data area of a designated page (or a predetermined page) from the host system 20, and write ECCs corresponding to the original data and the copied data to a redundant area of the page.

The foregoing steps will be described below more specifically.

First, the MPU 111 prepares system data (original data) and its copied data on the data buffer 113a (step S11). Then, the MPU 111 resets the ECC enable flag temporarily and enables it again, sets an internal flag (ECC SEL0) for selecting data, which should be written as lower-side data, and executes the macro instruction "movw" (steps S12 and S13). The original data is thus read out of the data buffer 113a and transferred to the lower side of the data register 122 of the flash memory 12 via the memory controller 115, and an ECC corresponding to the original data is generated and written to the ECC register 116A.

The MPU 111 resets the ECC enable flag temporarily and then enables it again, sets an internal flag (ECC SEL1) for selecting data, which should be written as upper-side data (copied data), and executes the macro instruction "movw" (steps S14 and S15). Thus, the copied data is read out of the data buffer 113a and transferred to the upper side of the data register 122 of the flash memory 12 via the memory controller 115, and an ECC corresponding to the copied data is generated and written to the ECC register 116A.

After that, the MPU 111 reads the ECCs corresponding to the original data and the copied data from the ECC register 116A and transfers them to their respective storage locations in the data register 122 of the flash memory 12 (step S16).

The MPU 111 issues a page write command (cmd) and a page address (address) to the flash memory 12 through the memory controller 115 (steps S17 and S18). Thus, the original data and its copied data and their corresponding ECCs, which are set in the data register 122 of the flash memory 12, are written together to the page addressed by the page address (address).

(Flow of Data Read Operations)

Figure 9:
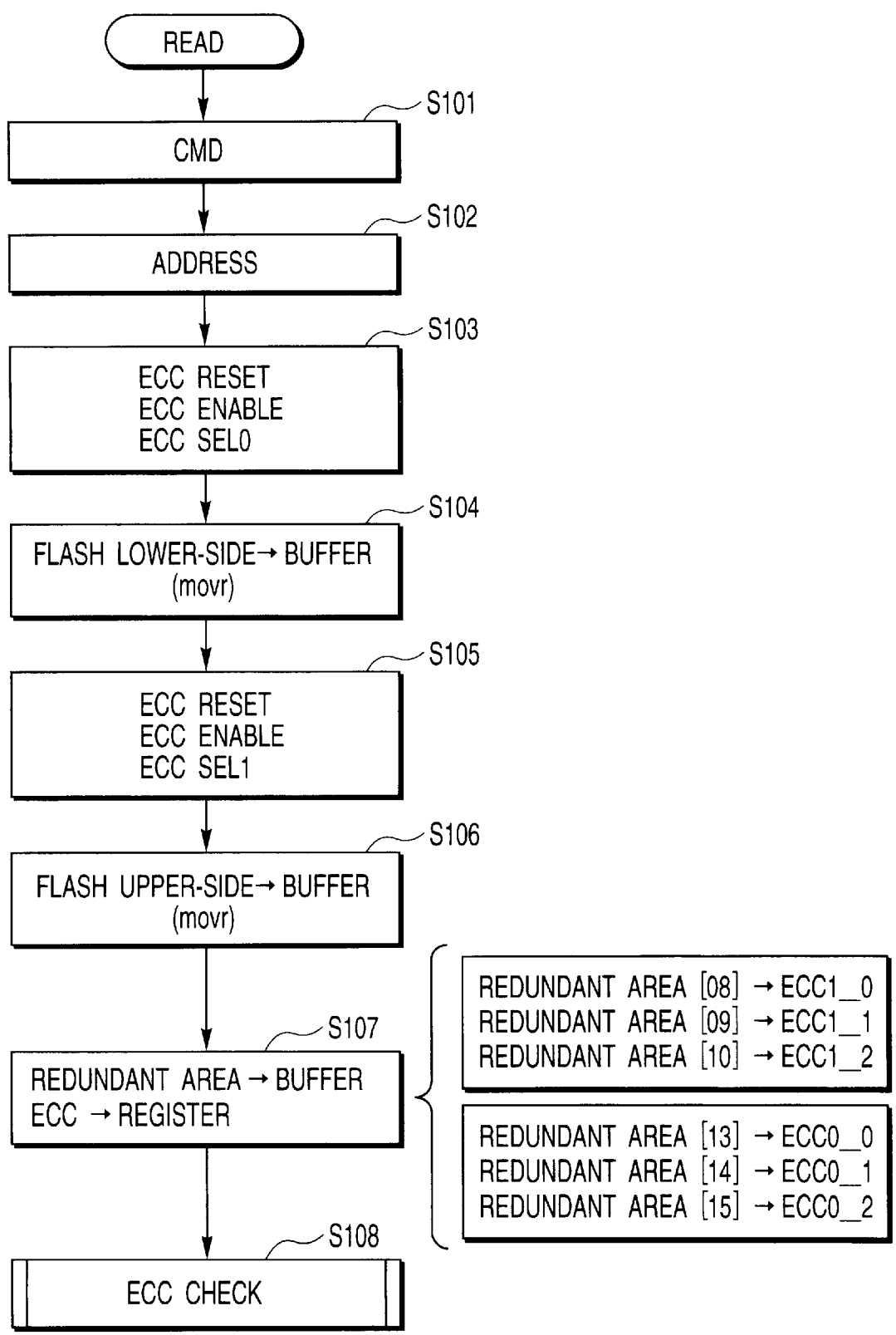
FIG. 9 is a flowchart showing a process of the read operation of the data storage device shown in FIG. 1.

A sequence of data read operations will now be described with reference to the flowcharts shown in FIGS. 9 and 10.

First, the MPU 111 issues a page read command (cmd) and a page address (address) by read request of the host system 20 (steps S101 and S102). Thus, data of one page (the original data and its copied data, and their corresponding ECCs) is read out of the page addressed by the page address and supplied to the data register 122 of the flash memory 12.

Then, the MPU 111 resets the ECC enable flag temporarily and enables it again, sets an internal flag (ECC SEL0) for selecting the lower-side data, and executes the macro instruction "movr" (steps S103 and S104). The lower-side data (original data) is therefore read out of the data register 112 of the flash memory 12 and transferred to the data buffer 113a, and an ECC corresponding to the lower-side data is generated and written to the ECC register 116A. Then, the MPU 111 resets the ECC enable flag temporarily and enables it again, sets an internal flag (ECC SEL1) for selecting the upper-side data, and executes the macro instruction "movr" (steps S105 and S106). The upper-side data (copied data) is read out of the data register 112 of the flash memory 12 and transferred to the data buffer 113a, and an ECC corresponding to the upper-side data is generated and written to the ECC register 116A.

After that, the ECCs read out of redundant area are transferred from the data register 122 of the flash memory 12 to the data buffer 113a (step S107). These ECCs are compared with those stored in the ECC register 116A to perform an ECC error check operation (step S108).

The ECC error check operation is done by the MPU 111 through the steps in the flowchart shown in FIG. 10.

First, it is determined whether an error occurs in both the lower- and upper-side data (step S201). If a 0-bit error occurs in both the lower- and upper-side data (YES in step S201), the lower-side data is selected and copied to a buffer in the RAM 113 for reading the data and supplying it to the host system 20 (step S202).

When a 1-bit error occurs in only one of the lower- and upper-side data, the data in which the error does not occur is selected and copied to the reading buffer (steps S203 to S206).

If a bit error occurs in both the lower- and upper-side data, and the bit error in the lower-side data is a 1-bit error, the lower-side data is corrected using an ECC corresponding thereto and the corrected data is copied to the reading buffer (steps S207 and S208). If the bit error in the lower-side data is a 2-bit error and that in the upper-side data is a 1-bit error, the upper-side data is corrected using an ECC corresponding thereto, and the corrected data is copied to the reading buffer (steps S209 and S210). Thus, the ECC error check and correction is executed as described with reference to FIG. 5.

According to the present embodiment described above, even when an uncorrectable bit error occurs in one of system data and its copied data, correct data can be read out using the other data in which the error does not occur. Since the system data and the copied data are stored in the same page, they can be read by one read operation, with the result that the device can be prevented from decreasing in operation performance.

In the foregoing embodiment, the present invention is described taking a writable memory card. However, a read-only memory card can produce the same advantage if important data is copied in advance on the same page by the method of the present embodiment.

Basically data is read sector by sector even in a recording medium, such as a magnetic disk drive and an optical disk drive, as well as a memory card. If, therefore, a block data including system data and its copied data is recorded on the data area of a sector and ECCs corresponding to the system data and the copied data are recorded on the redundant area of the sector, the same advantage as that of the present embodiment can be obtained.

Consequently, according to the embodiment of the present invention, the reliability of important storage data, such as system data necessary for security, can greatly be improved without degrading the system performance.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A data storage device for storing data, comprising:
   a nonvolatile semiconductor memory, including a plurality of pages each having a data area and a redundant area, for allowing a data read/write operation to be performed in units of page;
   means for generating a first error correcting code and a second error correcting code from first data and second data, respectively, the first data being to be written and the second data being a copy of the first data;
   a write control unit configured to write the first data and the second data to the data area in one page of the nonvolatile semiconductor memory and write the first and second error correcting codes, which are generated by the error correcting code generating means, to the redundant area of the one page to which the first data and the second data are written;
   a read control unit configured to read the first and second data and the first and second error correcting codes from the one page of the nonvolatile semiconductor memory in accordance with a data read request from a host system; and
   means for detecting an error in the read first and second data using the read first and second error correcting codes, and selecting one of the read first data and the read second data as data to be supplied to the host system in accordance with a result of error detection.

2. The data storage device according to claim 1, wherein the error detecting means includes:
   means for generating third and fourth error correcting codes from the read first and second data, respectively; and
   means for comparing the generated third and fourth error correcting codes with the read first and second error correcting codes, and detecting an error in each of the read first and second data based on a comparison result.

3. A memory card comprising: a card-like housing; and the data storage device according to claim 1, provided in the housing.

4. The data storage device according to claim 1, wherein the first data to be written is system data necessary for securing data stored in the nonvolatile semiconductor memory, and the first data has a data size half or smaller than that of the data area of the page.

5. A data storage device for storing digital contents and system data necessary for securing the digital contents, comprising:
   a nonvolatile semiconductor memory, including a plurality of pages each having a data area and a redundant area, for allowing a data read/write operation to be performed in units of page;
   means for generating a first error correcting code and a second error correcting code from the system data to be written and copied data thereof, respectively;
   write control unit configured to write the system data and the copied data to the data area in one page of the nonvolatile semiconductor memory and write the first and second error correcting codes, which are generated by the error correcting code generating means, to the redundant area of the ore page to which the system data and the copied data are written;
   a read control unit configured to read the system and copied data and the first and second error correcting codes from the one page of the nonvolatile semiconductor memory in accordance with a data read request from a host system; and
   means for detecting an error in the read system data and the read copied data using the read first and second error correcting codes, and selecting one of the read system data and the read copied data as data to be supplied to the host system in accordance with a result of error detection.

6. The data storage device according to claim 5, wherein the error detecting means includes:
   means for generating third and fourth error correcting codes from the read system and copied data, respectively; and
   means for comparing the generated third and fourth error correcting codes with the read first and second error correcting codes, and detecting an error in each of the read system and copied data based on a comparison result.

7. A memory card comprising: a card-like housing; and the data storage device according to claim 5, provided in the housing.

8. The data storage device according to claim 5, wherein the system data has a data size half or smaller than that of the data area of the page.

9. A method of controlling a data storage device for storing data in a nonvolatile semiconductor memory, the nonvolatile semiconductor memory including a plurality of pages each having a data area and a redundant area and performing a data read/write operation in units of page, the method comprising:
   generating a first error correcting code and a second error correcting code from first data and second data, respectively, the first data being to be written and the second data being a copy of the first data;

writing the first data and the second data to the data area in one page of the nonvolatile semiconductor memory, and writing the generated first and second error correcting codes to the redundant area of the one page to which the first data and the second data are written;

reading the first and second data and the first and second error correcting codes from the one page of the nonvolatile semiconductor memory in accordance with a data read request from a host system;

detecting an error in the read first and second data using the read first and second error correcting codes; and selecting one of the read first data and the read second data as data to be supplied to the host system in accordance with a result of error detection.

10. The method according to claim 9, wherein the error detecting includes:

generating third and fourth error correcting codes from the read first and second data, respectively; and comparing the generated third and fourth error correcting codes with the read first and second error correcting codes, and detecting an error in each of the read first and second data based on a comparison result.

11. A method of controlling a data storage device for storing digital contents and system data necessary for securing the digital contents in a nonvolatile semiconductor memory, the nonvolatile semiconductor memory including a plurality of pages each having a data area and a redundant area and performing a data read/write operation in units of page, the method comprising:

generating a first error correcting code and a second error correcting code from the system data to be written and copied data thereof, respectively;

writing the system data and the copied data to the data area in one page of the nonvolatile semiconductor memory, and writing the generated first and second error correcting codes to the redundant area of the one page to which the system data and the copied data are written;

reading the system and copied data and the first and second error correcting codes from the one page of the nonvolatile semiconductor memory in accordance with a data read request from a host system;

detecting an error in the read system data and the read copied data using the read first and second error correcting codes; and selecting one of the read system data and the read copied data as data to be supplied to the host system in accordance with a result of error detection.

12. The method according to claim 11, wherein the error detecting includes:

generating third and fourth error correcting codes from the read system and copied data, respectively; and comparing the generated third and fourth error correcting codes with the read first and second error correcting codes, and detecting an error in each of the read first and second data based on a comparison result.

* * * * *

UNITED STATES PATENT AND TRADEMARK OFFICE
CERTIFICATE OF CORRECTION

PATENT NO. : 6,769,087 B2
DATED : July 27, 2004
INVENTOR(S) : Moro et al.

It is certified that error appears in the above-identified patent and that said Letters Patent is hereby corrected as shown below:

Column 10,
Line 28, change "ore page" to -- one page --.

Signed and Sealed this

Twenty-eighth Day of September, 2004

JON W. DUDAS
*Director of the United States Patent and Trademark Office*